(12) United States Patent
Godfrey (10) Patent No.: US 10,837,805 B2
(45) Date of Patent: Nov. 17, 2020

(54) FIBRE OPTIC CABLE WITH TUNED TRANSVERSE SENSITIVITY

(71) Applicant: OPTASENSE HOLDINGS LIMITED, Farnborough (GB)

(72) Inventor: Alastair Godfrey, Farnborough (GB)

(73) Assignee: OptaSense Holdings Limited, Hampshire (GB)

(*) Notice: Subject to any disclaimer, the term of this patent is extended or adjusted under 35 U.S.C. 154(b) by 0 days.

(21) Appl. No.: 15/516,719

(22) PCT Filed: Oct. 8, 2015

(86) PCT No.: PCT/GB2015/052940
§ 371 (c)(1),
(2) Date: Apr. 4, 2017

(87) PCT Pub. No.: WO2016/055787
PCT Pub. Date: Apr. 14, 2016

(65) Prior Publication Data
US 2017/0292862 A1 Oct. 12, 2017

(30) Foreign Application Priority Data
Oct. 8, 2014 (GB) .................................. 1417836.2

(51) Int. Cl.
*G01D 5/353* (2006.01)
*G01K 11/32* (2006.01)
(Continued)

(52) U.S. Cl.
CPC .......... *G01D 5/3538* (2013.01); *G01H 9/004* (2013.01); *G01K 11/32* (2013.01); *G01L 1/243* (2013.01);
(Continued)

(58) Field of Classification Search
CPC .. G01D 5/3538; G02B 6/4415; G02B 6/4432; G02B 6/4433; G01H 9/004; G01K 11/32;
(Continued)

(56) References Cited

U.S. PATENT DOCUMENTS

| | | | |
|---|---|---|---|
| 4,990,769 A | 2/1991 | Hazan et al. | |
| 4,996,884 A | 2/1991 | Ross et al. | |

(Continued)

FOREIGN PATENT DOCUMENTS

| | | |
|---|---|---|
| CN | 2783292 | 5/2006 |
| CN | 101221079 | 7/2008 |

(Continued)

OTHER PUBLICATIONS

National Intellectual Property Administration, P.R. China, Third Office Action dated Aug. 11, 2020, issued in connection with Chinese Patent Application No. 201580066947.5, filed on Oct. 8, 2015, 19 pages (English translation).

*Primary Examiner* — Tony Ko
(74) *Attorney, Agent, or Firm* — McDonnell Boehnen Hulbert & Berghoff LLP (57) ABSTRACT

This application relates to a fibre optic cable structure suitable for use as a sensing fibre optic for distributed acoustic sensing and having an improved sensitivity to transverse pressure waves. The application describes a fibre optic cable (300) having a longitudinal cable axis and comprising at least one optical fibre (301). The cable also comprises a compliant core material (303) mechanically coupled to the optical fibre(s), possible via a buffer (302) such that a longitudinal force acting on the compliant core material induces a longitudinal strain in the optical fibre(s). At least one deformable strain transformer (304) is coupled to the compliant core material and configured such that a force acting on the strain transformer in a direction transverse to the cable axis results in a deformation of the strain (Continued)

transformer thereby applying a longitudinal force to the compliant core material.

21 Claims, 4 Drawing Sheets (51) Int. Cl.
*G01L 1/24* (2006.01)
*G02B 6/44* (2006.01)
*G01M 5/00* (2006.01)
*G01R 33/032* (2006.01)
*G01H 9/00* (2006.01)

(52) U.S. Cl.
CPC ....... *G01M 5/0091* (2013.01); *G01R 33/0327* (2013.01); *G02B 6/4415* (2013.01); *G02B 6/4432* (2013.01); *G02B 6/4433* (2013.01)

(58) Field of Classification Search
CPC ... G01M 5/0091; G01R 33/0327; G01L 1/243
See application file for complete search history.

(56) References Cited

U.S. PATENT DOCUMENTS

| | | | |
|---|---|---|---|
| 6,122,427 A | * | 9/2000 | Yokokawa ........... G02B 6/4408 385/110 |
| 10,028,667 B2 | * | 7/2018 | Kishida ................ A61B 5/1459 |

FOREIGN PATENT DOCUMENTS

| | | |
|---|---|---|
| CN | 101852904 A | 10/2010 |
| GB | 2058394 | 4/1981 |
| GB | 2188719 | 10/1987 |
| GB | 2312794 | * 11/1997 |
| GB | 2442745 | 4/2008 |
| JP | 2011 163943 | 8/2011 |
| WO | WO 95/30926 | 5/1995 |
| WO | WO 2002/097503 | 12/2002 |
| WO | 2010/034321 | 4/2010 |
| WO | WO 2012/137021 | 10/2012 |
| WO | WO 2012/137022 | 10/2012 |
| WO | WO 2013/098321 | 7/2013 |
| WO | WO 2014/176522 | 10/2014 |

* cited by examiner

FIBRE OPTIC CABLE WITH TUNED TRANSVERSE SENSITIVITY

FIELD OF THE INVENTION

This application relates to fibre optic cables and methods of manufacture thereof that are suitable for use for fibre optic sensing, especially for fibre optic distributed acoustic sensing and in particular to a fibre optic cable structure with a tuned sensitivity to transverse strains.

BACKGROUND OF THE INVENTION

Distributed acoustic sensing (DAS) is a known type of sensing where an optical fibre is deployed as a sensing fibre and interrogated with electromagnetic radiation to provide sensing of acoustic activity along its length, i.e. dynamic strains acting on the sensing fibre. By analysing the radiation backscattered from within the fibre, the fibre can effectively be divided into a plurality of discrete sensing portions which may be (but do not have to be) contiguous. Within each discrete sensing portion mechanical disturbances of the fibre, for instance, dynamic strains due to incident acoustic waves, cause a variation in the properties of the radiation which is backscattered from that portion. This variation can be detected and analysed and used to give a measure of the intensity of disturbance of the fibre at that sensing portion. Thus the DAS sensor effectively acts as a linear sensing array of acoustic sensing portions of optical fibre.

Some fibre optic based sensors rely on deliberately introduced features within the fibre, e.g. fibre Bragg gratings or the like, to induce reflection from a point in the fibre. In a fibre optic distributed acoustic sensor however the radiation which is backscattered from inherent scattering sites within the fibre is detected. The sensing function is thus distributed throughout the fibre and the spatial resolution and arrangement of the various sensing portions depends on the characteristics of the interrogating radiation and the processing applied.

Various types of DAS sensor have been demonstrated including sensors based on Rayleigh scattering of coherent light from the sensing fibre. Light transmitted into an optical fibre will be Rayleigh scattered from the various inherent, i.e. intrinsic, scattering sites within an optical fibre. A mechanical vibration or dynamic strain acting on the fibre, such as caused by an incident acoustic wave, will effectively alter the distribution of scattering sites resulting in a detectable change in the properties of the Rayleigh backscattered light. Analysing such changes allows vibrations/acoustic stimuli acting on sensing portions of the optical fibre to be detected.

Such DAS sensors therefore typically perform repeated interrogations of the sensing fibre where each interrogation involves transmitting at least one pulse of coherent optical radiation into the optical fibre and detecting the intensity of backscattered light from each of a number of sensing portions of the sensing fibre, also called channels, of the DAS sensor. In one type of DAS sensor the intensity of Rayleigh backscatter from a given channel in response to separate interrogations of the sensing fibre is monitored to determine any acoustic stimulus acting on the fibre and in one example each interrogation involves launching a single continuous pulse of coherent interrogating radiation. As mentioned above the backscatter from the fibre will depend on the distribution of the inherent scattering sites within the fibre, which will vary effectively randomly along the length of the fibre. Thus the backscatter intensity from any given interrogating pulse will exhibit a random variation from one sensing portion to the next but, in the absence of any environmental stimulus, the backscatter intensity from any given sensing portion should remain the same for each repeated interrogation (provided the characteristics of the interrogating pulse remains the same). However an environmental stimulus acting on the relevant sensing portion of the fibre will result in an optical path length change for that section of fibre, e.g. through stretching/compression of the relevant section of fibre and/or a refractive index modulation. As the backscatter from the various scattering sites within the sensing portion of fibre will interfere to produce the resulting intensity, a change in optical path length will vary the degree of interference and thus result in a change in backscatter intensity. This change in intensity can be detected and used as an indication of a disturbance acting on the fibre, such as an incident acoustic wave.

In another type of DAS sensor the backscatter signal is processed to determine a phase change. In one example each interrogation involves launching two pulses of coherent radiation of differing optical frequencies into the fibre. This means that the Rayleigh backscatter received at the detector comprises backscatter from both pulses, which will interfere, and thus there will be a signal component at the frequency difference between the pulses. If the two pulses are spatially separated in the fibre then an environmental disturbance acting on the fibre, between portions of the fibre where the pulses are reflected from, can lead to an optical path length change. This in turn will produce a phase change in the signal at this difference frequency, which can be thought of as a signal at a carrier frequency. By an appropriate choice of carrier frequency and processing of the detected signal this phase change can be related to the amplitude of the disturbance acting on the fibre. Again the characteristics of the interrogating radiation, i.e. the frequencies and durations of the two pulses, would typically be the same for each interrogation. Such a phase based DAS system can provide an indication of the actual amount of phase shift caused by an incident stimulus and thus provide a quantitative measure of amplitude of any disturbance.

As the sensing response of such DAS sensors is to changes in effective optical path length of the sensing fibre, the sensing fibre will generally be most sensitive to longitudinal strains acting on the optical fibre. For a sensing fibre optic deployed in a medium along a generally straight path, the sensing fibre will thus be most sensitive to pressure waves in the medium that are propagating in a direction longitudinally along the fibre. For such longitudinal waves the fibre length is directly affected by the pressure change as the medium compresses and expands as the wave propagates. For waves travelling perpendicularly to the optical fibre the sensitivity is lower as the fibre will largely be moved from side to side with the medium. There will be some longitudinal strain due to the displacement of the fibre and also from the diameter change of the fibre as the pressure wave passes but the effect will be much lower than for an equivalent wave travelling longitudinally.

DAS sensors of the type described above have been usefully proposed for a number of applications such as monitoring of perimeters or borders or linear assets such as pipelines or the like for intruder detection or tampering. For many such applications a DAS sensor using a conventional optical fibre is sufficiently sensitive to detect the events of interest. For example in a fibre deployed to detect digging near an asset such as a buried pipeline or a border fence there would be expected to be a significant ground disturbance during the event of interest and a DAS sensor using a conventional optical fibre could be used to detect such a disturbance. Due to the proximity of the origin of the disturbance in such applications, there will typically be significant transverse and longitudinal pressure signals from such a disturbance. Therefore sensitivity in one direction is sufficient to enable detection.

Additionally or alternatively in some applications the fibre optic cable may be deployed in a path such that pressure waves from a direction of interest will be incident with a substantial longitudinal component for at least some parts of the fibre. For example consider a sensing fibre buried along the path of an asset such as a pipeline where it is wished to detect incident signals from either side of the pipeline. The sensing fibre could be buried to run along the length of the pipeline but with a meandering or serpentine path. Pressure waves propagating in a direction which is generally perpendicular to the path of the pipeline will therefore be incident as substantially transverse waves for parts of the fibre but for other parts of the fibre there will be a significant longitudinal component. The spatial resolution of a sensing fibre deployed in such a manner will depend, at least partly, on the pitch of the meanders. Ideally the pitch of the meanders needs to be less than the length of an individual sensing portion channel. Such an arrangement is hard to install in practice.

In some applications it may not be practical or convenient to install an optical fibre cable in a location of interest with a path such that incident waves from a direction of interest are incident on the cable with a substantial longitudinal component.

For example DAS sensors have been considered for geophysical surveying such as seismic surveying of reservoirs or earth formations or the like. In one form of such seismic surveying, Vertical Seismic Profiling (VSP), an array of sensors is typically located in a borehole and used to detect seismic signals travelling to the sensors from the surrounding earth formation. Conventional VSP relies on an array of sensors such as a string of geophones and/or hydrophones located down a borehole. It has been proposed however to use DAS with a sensing fibre deployed down the borehole. In such an application sensitivity to pressure waves travelling transversely from the surrounding earth formation to the borehole is desired.

Were the optical fibre to be deployed to run in a generally straight path down the borehole then the DAS sensor may be relatively insensitive to the incident transverse signals of interest. The sensitivity of the DAS sensor could be improved by arranging the fibre optic cable in a coiled or helical arrangement down the borehole but general the cable structures used for down hole applications are relatively stiff and do not readily coil. This also generally requires some element to coil the cable around and increases the complexity and cost or cable deployment.

Another approach that has been proposed is to coil the optical fibre within the cable structure itself, for instance by winding the optical fibre around a compliant central core. The resulting cable can thus be deployed to run in a generally straight path, such as down a borehole, with the optical fibre within the cable describing a helical path. Pressure waves propagating transversely to the cable with therefore have a longitudinal component for parts of the optical fibre within the cable structure. However the diameter of the central core, which defines the winding radius of the optical fibre, must not be too low or the optical fibre may suffer from bend losses. This results in a large diameter cable which may not be appropriate for some applications. Producing a fibre optic cable with a helical wound optical fibre also involves relatively difficult and bespoke cable manufacture and typically results in a relatively fragile cable that requires great care in installation. Also winding the optical fibre in this way means that a given length of cable will contain a greater length of optical fibre than a cable where the optical fibre is not so wound, and potentially much greater. In other words if a given length of optical fibre is to be used as the sensing fibre the length of the resulting cable structure is potentially much shorter through the use of helical winding, with a possible reduction in range that a given sensing cable can monitor.

Similar issues arise with surface seismic sensing which conventionally has been performed using an array of geophones deployed in an array over the surface of an area to be surveyed. It has been proposed to use DAS with a sensing fibre buried in shallow trenches in the area of interest. In such an arrangement the fibre optic cable would be deployed in a path which was largely near horizontal but the signals of interest would be travelling with a large vertical component and thus would be incident transversely to the fibre optic cable.

It would therefore be desirable, for some applications, to provide a fibre optic cable structure that can be used as a sensing fibre for DAS that has an improved sensitivity to transverse waves and/or which mitigates at least some of the disadvantages mentioned above.

The principles of Rayleigh based distributed fibre optic sensing have also been applied for other sensing applications. For instance it has been proposed to use a magnetically sensitised optical fibre to provide a distributed fibre optic sensor for magnetic field variations. The magnetically sensitised optical fibre may be mechanically coupled to a magnetostrictive material whose dimensions vary according to the strength of the applied magnetic field. Variations in the magnetic field thus result in variations in the dimensions of the magnetostrictive material which translate to dynamic strains being applied to the optical fibre. Such dynamic strains can be detected using the principles of DAS and used to provide an indication of any variation in magnetic field along the length of the fibre. It will be appreciated however that effective changes in optical path length due to incident pressure waves will also result in variations in the detected backscatter from the sensing fibre and may mask the detection of any changes due solely to a magnetic field variation. Likewise it has been proposed to use distributed fibre optic sensing based on Rayleigh backscatter to provide an indication of any dynamic temperature variations along the length of the fibre but again it may be difficult to discriminate in the detected backscatter signal between effects due to a temperature change and effects due to incident pressure waves. In such applications therefore it may be desirable to use a sensing optical fibre that it sensitised to the measurand of interest but which is relatively insensitive to incident pressure waves.

SUMMARY OF THE INVENTION

Thus according to an embodiment of the present invention there is provided a fibre optic cable having a longitudinal cable axis comprising;
at least one optical fibre;
a compliant core material mechanically coupled to the at least one optical fibre such that a longitudinal force acting on the compliant core material induces a longitudinal strain in the at least one optical fibre; and
at least one deformable strain transformer coupled to the compliant core material and configured such that a force acting on the strain transformer in a direction transverse to the cable axis results in a deformation of the strain transformer thereby applying a longitudinal force to the compliant core material.

The at least one optical fibre may be deployed within the cable to run generally parallel to the cable axis. The at least one optical fibre may be tightly coupled to a buffer material and the buffer material may be coupled to the compliant core material.

In some embodiments at least a portion of the strain transformer has a shape with a resting longitudinal length in the absence of any external force applied to the cable and is configured such that deformation of the strain transformer in response to a force transverse to the cable axis over a first portion of the cable causes a change in the longitudinal length of strain transformer. By longitudinal length is meant a dimension of the strain transformer along the cable axis.

In some embodiments at least a portion of the strain transformer has a shape which is convex with respect to the cable axis when viewed from a direction perpendicular to the cable axis.

The at least one strain transformer may be tightly bonded to compliant core material and/or anchored to the compliant core material at a plurality of anchor points. In some embodiments at least one strain transformer is at least partly embedded with the compliant core material.

The at least one strain transformer may comprise at least one helically coiled member. The helically coiled member may be coiled around the compliant core member. The helix angle of the helically coiled member may less than 45 degrees and/or greater than 5 degrees. The diameter of the helically coiled member may be in the range of 3 to 10 mm.

At least one portion of the fibre optic cable may comprise a plurality of strain transformers, each strain transformer comprising a helically wound coiled member. At least one helically wound coiled member may be wound in the opposite direction to another helically wound coiled member and/or at least one helically wound coiled member may be interleaved with another helically wound coiled member.

The strain transformer may be stiffer than the compliant core material.

The strain transformer and compliant core material may have a strain response of between 0.05% to 0.01% strain per Newton tensile load.

The strain transformer may comprise a metallic material. The strain transformer may comprise a shaped steel member.

The compliant core material may comprise extruded nylon.

In some embodiments the cable may comprise a first jacket layer with the at least one optical fibre, the compliant core material and the at least one strain transformer being disposed within the first jacket layer. In some embodiments at least part of the strain transformer may be coupled or attached to the first jacket layer. In some embodiments however strain transformer and compliant core material may be disposed so as to be moveable with respect the first jacket layer. The at least one optical fibre, the compliant core material and the at least one strain transformer may be disposed within a liquid contained within the first jacket layer. In some embodiments the at least one optical fibre, the compliant core material and the at least one strain transformer may be contained within a second jacket layer which is disposed within the first jacket layer, with the second jacket layer being moveable with respect to the first jacket layer.

The cable may be configured to provide a desired sensitivity to incident transverse acoustic waves when the optical fibre is used for distributed acoustic sensing (DAS).

That is the design of the strain transformer with respect to the compliant core material and the optical fibre may be arranged to provide a desired degree of sensitivity. In some applications the cable may be designed to provide a relatively high transverse sensitivity. The strain transformer may thus be configured to ensure that the transverse sensitivity of the cable when used for distributed acoustic sensing is greater than would otherwise be the case if the strain transformer were not present. The design of the strain transformer with respect to the compliant core material and the optical fibre may be configured to ensure that the transverse sensitivity of the cable when used for distributed acoustic sensing is greater than for a conventional fibre optic cable having the same type of optical fibre and one or more jacket layers.

As used here the term high sensitivity may be taken to mean that the magnitude of the response of the optical fibre of the cable is greater than the response of a corresponding optical fibre or a standard unbuffered optical fibre to a given transverse strain or pressure. For instance, as will be described in more detail below an unbuffered optical fibre may be expected to exhibit a variation in phase of a measurement signal of the order of −40 microradians per pascal per metre at a wavelength of around 1550 nm. In other words a measurement signal from a given 1 m length of unbuffered optical fibre interrogated using a 1550 laser source may be expected to vary by amount 40 microradians with a change in pressure of 1 Pa on that section of optical fibre. For a high sensitivity cable the magnitude of the phase change with pressure change may be greater, for instance at least 25% greater, or at least 50% greater. In some embodiments a high sensitivity cable may have a response which is at least 100% greater than for a standard unbuffered cable or at least five times greater or at least ten times greater. Thus a high sensitivity cable may be one where the response of an optical fibre to a traverse strain or pressure change in terms of path length change is of the order of 80 microradians per metre per Pa or greater, for instance greater than 200 microradians per metre per Pa.

In some embodiments however the design of the strain transformer with respect to the compliant core material and the optical fibre may be arranged to provide a relatively low transverse sensitivity. In some embodiments the design of the strain transformer with respect to the compliant core material and the optical fibre may be configured such that the optical fibre would be substantially insensitive to transverse acoustic signals if used for DAS. In other words such a fibre optic cable may be substantially insensitive to pressure variations.

As noted previously and as will be described in more detail below a dynamic strain acting on a portion of a sensing optical fibre of a DAS sensor may result in an effective change in optical path length for that portion, which may be detected by the DAS interrogation. The change in effective optical path length may arise at least partly through a physical change in length due to stretching or compression of the optical fibre and also at least partly through a refractive index modulation. It has been found that for some optical fibres the response to an increased pressure on a portion of the fibre—which may be expected to result in a lengthening of the fibre—is actually a seemingly reduction in the effective optical path length. Without wishing to be bound to any particular theory it is believed that the modulation of the refractive index in such cases may have an impact on the effective optical path length which is in the opposite sense to the impact of the physical length change. It is believed that the refractive index modulation depends, at least partly, on the surface pressure exerted on the optical fibre. If a given portion of such an optical fibre is subject to a pressure variation, i.e. a dynamic strain, that leads to stretching of the fibre, thus tending to increase the optical path length, the refractive index modulation that also arises due to the variation in pressure on the optical fibre may tend to reduce the optical path length. The overall impact on the effective optical path length is thus thought to be a combination of these effects and to depend on the relative contribution of each.

In some embodiments therefore the strain transformer may be designed with respect to the compliant material and optical fibre such that a transverse strain on a given portion of the cable results in substantially no change in the effective optical path length of that portion of the optical fibre. Thus any chance in effective optical path due to a physical change in length of the optical fibre is substantially offset by an opposite change in effective optical path, e.g. as may be due to the refractive index modulation.

In other words the strain transformer may be configured with respect to the compliant core material and the optical fibre such that in response to a given transverse strain the optical fibre experiences an effective change in optical path length due to a refractive index modulation which is substantially equal and opposite to an effective change in optical path length due to a physical length change. The strain transformer is thus configured to effectively amplify the physical length change of the optical fibre to a transverse strain so as to match the effective path length change due to a refractive index modulation.

It is believed that the cable with a strain transformer described above behaves as if the cable is under hydrostatic pressure, even if the ends of the cable don't see the pressure. As discussed the main effect on strain reversal in the cable structures having a strain transformer such as described above is that the mechanical advantage of the mesh wins and elongates the fibre even with pressure on the cable ends (as is the case with hydrostatic pressure), whereas unbuffered optical fibre physically shrinks with increasing pressure. Thus the strain variation and effective change in optical path length with increasing pressure can be varied from a small negative value to a large positive value thus use of the strain transformer arrangement. This implies that with the appropriate stiffness for the strain transformer one can cancel either strain or change in the effective optical path length. It should be noted that zero change in optical path length does not occur at the null strain design due to the refractive index change with pressure.

In another aspect there is provided a distributed acoustic sensing system comprising: a fibre optic cable as described above; and an interrogator unit for performing distributed acoustic sensing on said optical fibre.

The fibre optic cable may be deployed in a borehole.

An aspect of the invention also relates to the use of a fibre optic cable as described above for distributed acoustic sensing.

An aspect of the invention also relates to the use of a fibre optic cable as described above having a relatively high sensitivity to transverse acoustic signals for distributed acoustic sensing to perform a seismic survey.

An aspect of the invention also relates to the use of a fibre optic cable as described above which is relatively insensitive to transverse acoustic signals for distributed fibre optic sensing. In some embodiments the distributed fibre optic sensing may comprise sensing for variations in magnetic field, in which case the optical fibre may be coupled to a material whose dimensions vary based on magnetic field strength, e.g. a magnetostrictive material. In some embodiments the distributed fibre optic sensing may comprise sensing for temperature variations.

DESCRIPTION OF THE DRAWINGS

The invention will now be described by way of example only with respect to the accompanying drawings, of which.

DESCRIPTION OF THE INVENTION

Embodiments of the present invention relate to fibre optic cables suitable for use for fibre optic sensing, e.g. distributed acoustic sensing (DAS), having a desired or a tuned sensitivity to transverse strains. Some embodiments relate to fibre optic cables suitable for use for distributed fibre optic sensing having relatively good sensitivity to transverse strains, for example improved transverse sensitivity compared to conventional fibre optic cables. Other embodiments relate to fibre optic cables suitable for use for distributed acoustic sensing (DAS) that are substantially insensitive to transverse strains.

Figure 1:
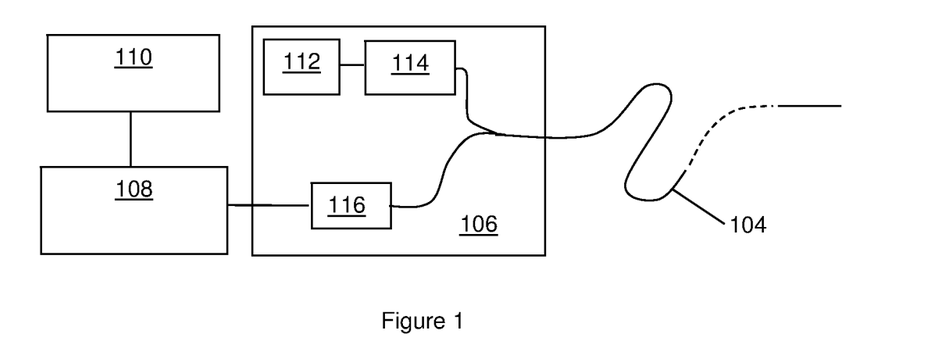
FIG. 1 illustrates a conventional DAS sensor apparatus.

FIG. 1 shows a schematic of a distributed fibre optic sensing arrangement. A length of sensing optical fibre 104 is removably connected at one end to an interrogator 106.

The output from interrogator 106 is passed to a signal processor 108, which may be co-located with the interrogator or may be remote therefrom, and optionally a user interface/graphical display 110, which in practice may be realised by an appropriately specified PC. The user interface may be co-located with the signal processor or may be remote therefrom.

The sensing fibre 104 can be many kilometres in length and can, in some applications be tens of kilometres in length. In conventional DAS the sensing fibre may be a standard, unmodified single mode optic fibre such as is routinely used in telecommunications applications without the need for deliberately introduced reflection sites such a fibre Bragg grating or the like. The fibre will be protected by containing it with a cable structure which may contain more than one optical fibre.

In use the fibre optic cable comprising the sensing fibre 104 is deployed in an area of interest to be monitored. In operation the interrogator 106 launches interrogating electromagnetic radiation, which may for example comprise a series of optical pulses having a selected frequency pattern, into the sensing fibre. The optical pulses may have a frequency pattern as described in GB patent publication GB2,442,745 or optical characteristics such as described in WO2012/137022, the contents of which are hereby incorporated by reference thereto, although DAS sensors relying on a single interrogating pulse are also known and may be used. Note that as used herein the term "optical" is not restricted to the visible spectrum and optical radiation includes infrared radiation and ultraviolet radiation. As described in GB2,442,745 and WO2012/137022 the phenomenon of Rayleigh backscattering results in some fraction of the light input into the fibre being reflected back to the interrogator, where it is detected to provide an output signal which is representative of acoustic disturbances in the vicinity of the fibre. The interrogator therefore conveniently comprises at least one laser 112 and at least one optical modulator 114 for producing a plurality of optical pulses separated by a known optical frequency difference. The interrogator also comprises at least one photodetector 116 arranged to detect radiation which is Rayleigh backscattered from the intrinsic scattering sites within the fibre 104. A Rayleigh backscatter DAS sensor is very useful but systems based on Brillouin or Raman scattering are also known.

The signal from the photodetector is processed by signal processor 108. The signal processor conveniently demodulates the returned signal based on the frequency difference between the optical pulses. The processor may process the detected backscatter for example as described in any of GB2,442,745, WO2012/137021 or WO2012/137022. The signal processor may also apply a phase unwrap algorithm. The phase of the backscattered light from various sections of the optical fibre can therefore be monitored. As described previously any changes in the effective optical path length within a given section of fibre, such as would be due to incident pressure waves causing strain on the fibre, can therefore be detected.

The form of the optical input and the method of detection allow a single continuous fibre to be spatially resolved into discrete longitudinal sensing portions. That is, the acoustic signal sensed at one sensing portion can be provided substantially independently of the sensed signal at an adjacent portion. Note that the term acoustic shall be taken to mean any type of pressure wave or mechanical disturbance or varying strain generated on the optical fibre and for the avoidance of doubt the term acoustic will be used in the specification to include seismic signals and waves or other types of vibration. As used in this specification the term "distributed acoustic sensing" will be taken to mean sensing by optically interrogating an optical fibre to provide a plurality of discrete acoustic sensing portions distributed longitudinally along the fibre and the term "distributed acoustic sensor" shall be interpreted accordingly.

Such a sensor may be seen as a fully distributed or intrinsic sensor, as it uses the intrinsic scattering processed inherent in an optical fibre and thus distributes the sensing function throughout the whole of the optical fibre.

Figure 2:
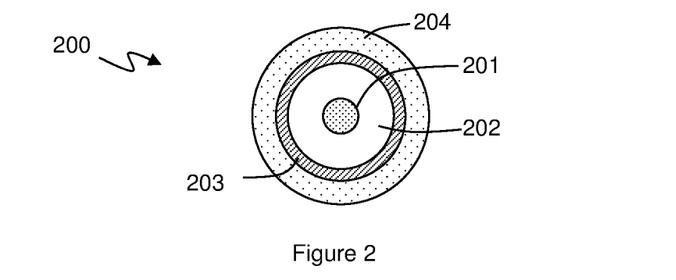
FIG. 2 illustrates a conventional fibre optic cable structure.

FIG. 2 illustrates generally one example of a known type of fibre optic cable 200 that could be used to provide the sensing fibre. FIG. 2 illustrates a cross section through the fibre optic cable. The fibre optic cable 200 comprises least one optical fibre 201, which will typically comprise a core and cladding and possibly a fibre jacket as will be well understood by one skilled in the art. In some applications there may be more than one optical fibre 201. The optical fibre(s) 201 may be located within a buffer material 202 for protection of the optical fibre. In some fibre optic cables the buffer may be a material that is tightly bound to the optical fibre(s) of the cable but other designs are known including gel filled cables where the gel provides the buffer material. In this example the buffer material 203 is surrounded by an armour layer 203. The armour layer 203 may be provided to provide strengthening and protection of the optical fibre(s) 201. In some applications the armour layer may be a metallic layer and may for instance comprise a tube of steel or similar material. In some applications however the cable is desired to have some flexibility and a steel tube would be too inflexible. In such instances the cable may comprise a flexible armour layer such as an aramid layer or braided metallic shield. The aramid or braided metallic layer will be tightly wound so as to form an effectively continuously armour layer to protect the fibre on all sides and bound to the buffer layer to protect the fibre layer from being overextended if subject to a longitudinal force, e.g. pulling on the cable. An outer jacket material 204 may be provided to give environmental protection, e.g. to make the cable watertight and/or gas impermeable.

One skilled in the art will of course appreciate that there are a variety of fibre optic cable designs and in other designs there may be additional armour layers or there may be no armour at all. In some designs there may be a central strength member such as a metallic rod or wire running along the path of the cable axis. There additionally may be more buffer and/or jacket layers.

A fibre optic cable 200 such as described with respect to FIG. 2 may be usefully employed in many applications for DAS. However as mentioned above if the optical fibre 201 of such a fibre optic cable 200 is used for DAS sensing such a sensing fibre will be preferentially sensitive to pressure waves propagating along the longitudinal axis of the cable. A longitudinal pressure wave will cause a compression of the medium in which the fibre optic cable is deployed. At least some of the force due to the pressure wave, i.e. the dynamic strain, will be transmitted to the optical fibre 201 via the intermediate layers (the amount of coupling being dependent on the properties of the intermediate layers). However a pressure wave propagating transversely with respect to the cable axis (i.e. the longitudinal cable axis) may largely cause the fibre optic cable to move from side to side, especially if any armour or strength layer 203 comprises a relatively flexible material such as aramid.

Embodiments of the present invention provide fibre optic cables where the fibre optic cable comprises at least one strain transformer for transforming a radial force on the cable to a longitudinal force on the optical fibre, in other words to transform a dynamic strain on the strain transformer in a direction transverse to the cable axis to a longitudinal strain on the optical fibre. Note that as used herein the term "cable axis" shall be refer to an axis that runs longitudinally along the length of the cable. Thus the cable axis can be thought of as a path along which the cable runs. It will be appreciated that the direction of the cable axis may vary along the length of the cable and may be curved or meandering or straight in various sections depending on the deployment of the cable.

Thus in one embodiment a fibre optic cable comprises at least one optical fibre. A compliant core material may be mechanically coupled to the optical fibre such that a longitudinal force acting on the compliant core material induces a longitudinal strain in the optical fibre. The fibre optic cable also comprises at least one deformable strain transformer coupled to the compliant core material and configured such that a force acting on the strain transformer in a direction transverse to the cable axis results in a deformation of the strain transformer thereby applying a longitudinal force to the compliant core material.

The strain transformer is configured, together with the compliant core material to be deformable in a transverse direction, i.e. locally perpendicular to the cable axis of the fibre optic cable, and to effectively translate a radial or transverse displacement into a longitudinal displacement applied to the compliant core material. In some embodiments the strain transformer has a shape with a resting longitudinal length, in the absence of any external force applied to the cable, which is configured such that deformation of the strain transformer in response to a force transverse to the cable axis over a first portion of the cable causes a change in the longitudinal length of strain transformer. By longitudinal length is meant a dimension along the cable axis.

At least a portion of the strain transformer may have a shape which is convex with respect to the cable axis when viewed from a direction perpendicular to the cable axis so as to transfer a transverse force into a longitudinal force. Alternatively in some embodiments at least a portion of the strain transformer may have a shape which is concave with respect to the cable axis when viewed from a direction perpendicular to the cable axis. This could also transfer a transverse force into a longitudinal force, albeit with a reversal of the strain direction compared to a convex embodiment.

In one embodiment the strain transformer may comprise a relatively stiff helical or similarly coiled member or element that is substantially helical or generally coiled about an axis that is parallel to the longitudinal cable axis.

Figure 3:
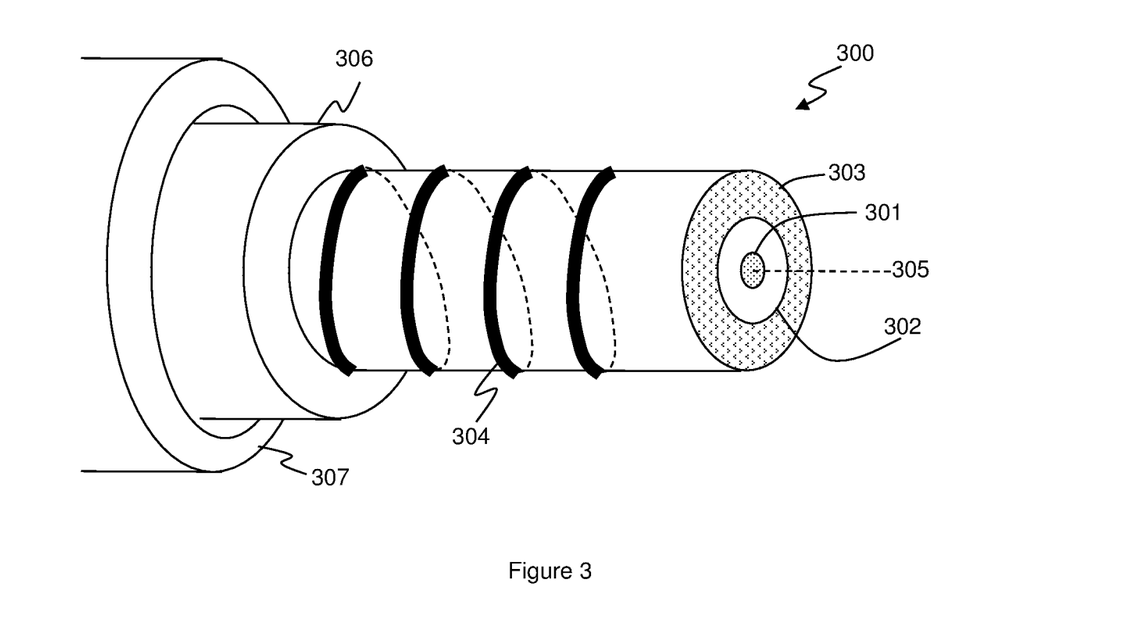
FIG. 3 illustrates an embodiment of a fibre optic cable structure according to an embodiment of the present invention.

FIG. 3 illustrates a perspective cutaway view of a fibre optic cable 300 according to an embodiment of the present invention. The fibre optic cable comprises at least one optic fibre 301. Only one optical fibre 301 is illustrated in FIG. 3 for clarity but it will be appreciated that the cable could comprise a plurality of optical fibres. Each optical fibre may comprise a core and cladding as would be understood by one skilled in the art. The optical fibre may also comprise at least one fibre jacket material.

The optical fibre(s) 301 may be coupled to a tight buffer material 302 which is itself coupled to a compliant core material 303. The coupling between the optical fibre 201 and the compliant core material 303 is such that a dynamic longitudinal strain applied to the compliant core material will induce a longitudinal strain in the optical fibre. In other words a longitudinal displacement of the compliant core material will result in a longitudinal displacement of the buffer material and correspondingly the optical fibre 301. Thus the optical fibre will not slide significantly within the core material 303 or buffer 302, at least for dynamic strains resulting from pressure waves of the frequencies of interest. In some embodiments the material 303 of the compliant core may also act as the buffer material 302, i.e. a separate buffer material 302 may not be required.

In some embodiments the buffer material 302 may be a gel or gel-like material. Various gel buffers are known for fibre optic cables. A relatively sudden longitudinal movement of the compliant core material 303 will cause a longitudinal movement in a gel buffer material which will be transmitted to the embedded optical fibre 301. Thus a gel buffer can provide the coupling described above. However if the fibre optic cable is subject to relatively large and slow, i.e. low frequency strains, such as may be experienced during installation or handling of the fibre optic cable for instance, a gel buffer material may relax the strain experienced by the optical fibre. Thus use of a gel buffer material may help reduce the risk of damage during installation and handling whilst still providing good coupling at the frequencies of interest. Gel buffered fibre optic cables based on a conventional design, i.e. without a strain transformer, have been used previously as DAS sensing fibres and have performed well for incident longitudinal waves, showing good coupling between the fibre, gel buffer and outer cable layers at acoustic frequencies of interest.

Mechanically coupled to the compliant core material 304 is at least one strain transformer which in this embodiment comprises a coiled member 304 wound around the compliant core material 303. The coiled member 304 may be tightly bound to the compliant core material to effectively grip the compliant core material 303 so that the compliant core material moves with the strain transformer. In some embodiments however the strain transformer may additionally or alternatively be anchored to the compliant core material at various anchor points and/or at least part of the coiled member 304 may be embedded within the compliant core material. The coiled member in this example is coiled around the longitudinal cable axis 305 in a generally helical fashion and is surrounded by at least one cable jacket material 306. The cable jacket material may be arranged so that any pressure acting on the jacket material may be preferentially transferred to the strain transformer, rather than the compliant core material. In other words substantially no or only limited pressure may be transferred directly to the compliant core material from the jacket material.

The coiled member 304 of the strain transformer is relatively stiff and is stiffer than the compliant core material 303, and the buffer material 302 if present. The coiled member is however deformable in a radial direction in response to a dynamic transverse strain. Due to the helical winding, such deformation of the coiled member 304 results in a radial or diametrical change which translates into a longitudinal length change, as illustrated in FIG. 4

Figure 4:
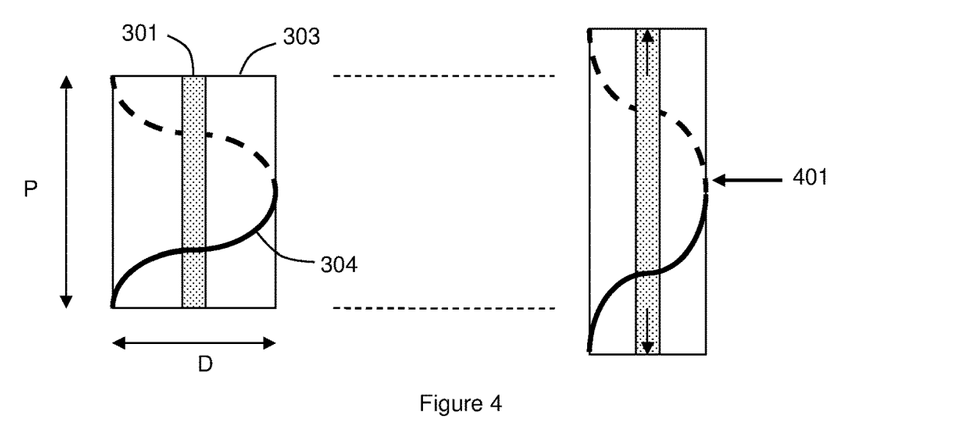
FIG. 4 illustrates the principles of a strain transformer for transforming a transverse force into a longitudinal force.

FIG. 4 illustrates a portion of the fibre optic cable with one complete winding of coiled helical member 304. FIG. 4 illustrates the path of the coiled member as viewed from a direction which is perpendicular to the longitudinal cable axis, i.e. a transverse direction. It can be seen that from such a view the coiled member has a shape that is convex with respect to the cable longitudinal axis, i.e. has a shape that bulges or curves outwards from the cable axis in a transverse direction. It will, of course, be understood that if the coiled member is coiled around the cable axis then the radial distance of the coil from the cable axis may be substantially constant. However when viewed from a given (fixed) transverse direction the path of the coiled member (or at least the projection of the path in a plane parallel to the cable axis) has a generally meandering or serpentine path with respect to the cable axis which defines a convex shape. In yet other words the shape of the strain transformer is such that the distance of the strain transformer from the cable axis in a first (fixed) transverse direction (e.g. x-axis component of distance) varies along the cable axis (e.g. the z-axis). This means that a transverse force 401 applied to the coiled member is at least partly transformed into a longitudinal force which results in a change in the longitudinal length of the strain transformer.

The left hand side of FIG. 4 illustrates the section of cable in the absence of an external force. This portion of the strain transformer, corresponding to a single winding, thus has a resting length equal to the pitch P of the coil or helical winding and a resting diameter D. The right hand side of FIG. 4 illustrates the situation with a transverse force 401 applied, such as may be applied by a pressure wave propagating transversely to the cable axis. The transverse force 401 results in a deformation of the strain transformer 304 in the radial direction which translates to a deformation in the longitudinal direction and thus a change in longitudinal length of this portion of the coiled member 304. The strain transformer thus responds to a transverse force to induce a longitudinal strain in the compliant core material 303 and hence the optical fibre 301.

Therefore if such a fibre optic cable is used for DAS sensing with the optical fibre 301 as the sensing fibre then pressure waves propagating transversely to the fibre optical cable can result in a dynamic longitudinal strain in the optical fibre with a resulting optical path length change, even though the optical fibre may generally run along a path which is parallel to the cable axis, i.e. without requiring a helical optical fibre arrangement. Such a fibre optic cable may therefore be configured to improve the sensitivity of the DAS sensor to acoustic/seismic stimuli propagating transversely to the fibre optic cable compared with a conventional fibre optic cable such as illustrated in FIG. 2.

Pressure on the outside of a fibre optic cable is transferred into change in effective optical path length by two main effects. The first is the physical change in length of the cable as the surface pressure is changed. The second is by the effect of the pressure on the effective refractive index of the fibre. The principle behind the strain transformer is to use a stiffening structure within the cable to mechanically enhance the way that diametrical strain (i.e. radial or transverse strain) is transferred to longitudinal strain.

The inclusion of the strain transformer can thus provide a controlled increase in the longitudinal strain experienced by the optical fibre in response to a given transverse strain or pressure variation acting on the cable. In some embodiments the cable may be designed to provide an enhanced sensitivity to transverse strains, when used for fibre optic sensing, compared to a conventional fibre optic cable.

The response of the strain transformer and compliant core material to a given transverse strain may be adapted for the particular application in which the DAS sensor may be employed.

For example in some applications the fibre optic cable may be deployed in use within a liquid medium. When deployed in a liquid medium a propagating pressure wave will result in a compression and rarefaction of the liquid medium surrounding the fibre optic cable and consequently of the fibre optic cable itself. For a fibre optic cable which in use is intended to be encased in a solid medium, such as buried in the ground or encased in cement for example, a propagating pressure wave will typically tend to produce a lateral force and the cable will be constrained from moving significantly. In this latter case where the cable is cemented in place or otherwise similarly embedded in a material or structure, the outer jacket layer of the cable may be restricted from significant longitudinal movement. In order for the strain transformer to be able to deliver the mechanical advantage and transform a transverse strain into a longitudinal strain the strain transformer should ideally be free to move longitudinally with respect to the outer jacket. Thus referring back to FIG. 3 the strain transformer may be arranged to be able to move relatively freely within jacket layer 306. Additionally or alternatively there may be at least one outer jacket layer 307 surrounding jacket layer 306, with jacket layer 206 free to effectively slide within the outer layer 307. In some embodiments there may be a small gap between the two layers which may be filled with a fluid, e.g. a liquid that allows relative movement between the jacket layers whilst transferring any incident pressure waves to the inner cable structure.

The mechanical advantage provided by the strain transformer will of the system will depend on the relative stiffness of the components, e.g. the coiled helical member and the compliant core material, as well as the helix angle of the helical winding.

The cable should ideally be stiff enough to install without too much stretch. In some embodiment the compliant core material may not be a continuous homogenous material but may have cavities or other internal features so that the bulk stiffness can be tailored for the relevant application. For example the compliant core material could be an extruded shape with holes and/or spokes. The core material should also be rigid enough not to collapse too much under any steady state pressure of the surrounding medium when deployed, e.g. from water pressure if deployed in water or from the surrounding ground in a buried application. In some embodiments the fibre optic cable structure, which may for instance comprise a single optical fibre may exhibit a strain/stiffness response of about 0.05% to 0.01% strain per Newton tensile load.

The helix angle of the strain transformer should be arranged to provide a desired mechanical advantage for the stain transformer but also chosen to provide a significant longitudinal force on the compliant core for a given transverse force on the strain transformer. In some embodiment the helix angle may be less than 45 degrees to provide the mechanical advantage. In some embodiment the helix angle may be greater than about 5 degrees. At an angle of around 5 degrees about 8% of the radial force is transformed to longitudinal force.

The diameter of the strain transformer may be relatively low, thus permitting the overall diameter of the cable structure to be relatively low. For example the diameter of the strain transformer may be of the order of 5 to 10 mm. In some instances the overall diameter of the cable may be of the order of 6 to 10 mm. If required however smaller diameter cables could be constructed using smaller diameter strain transformers and smaller diameter compliant cores, for instance a cable diameter of down to about 3 mm could be fabricated. In some applications however, e.g. for hydrophones types use, a larger diameter cable structure may be advantageous and it may be wished to use a larger diameter strain transformer structure.

The coiled member of the strain transformer may conveniently comprise a metallic material, for example steel. As mentioned the coiled member should be stiffer than the compliant core and optical fibre and yet still be deformable to transverse forces of interest. Steel can provide the required properties and can be worked to form a coiled structure relatively easily during cable manufacture. Stainless steel is stiff, corrosion resistant, readily available and reasonably cheap and has already been used in cable manufacture for different reasons. However other materials such as glass fibre or carbon fibre could potentially be used in some cable designs and possibly superelastic materials such as Nitinol.

The compliant core material should be suitably compliant so as to move with the strain transformer but should also be suitable for transferring an induced strain to the optical fibre or buffer material. One suitable compliant core material may be extruded nylon which is used in some fibre optic cable construction already. As mentioned above the compliant core material should be have sufficient stiffness for the required application and may in some instance have a non-homogeneous structure. In some embodiments for instance a closed cell foam material could be used and for example the pore fraction could be controlled to tune the stiffness for the required application. Other polymer materials could also be used.

Manufacture of a fibre optic cable according to the present invention may therefore involve initially producing one or more optical fibres in a tight buffered configuration in a core material such as extruded nylon using various conventional fabrication techniques before winding a suitable material such as a steel wire around the core material using known winding techniques. The core material with surrounding helically coiled member may then be encapsulated in one or more outer jacket materials using known manufacturing techniques. As mentioned above the outer jacket is arranged to apply any external pressure to the coiled member, but to substantially avoid applying pressure directly to the compliant core. The overall cable structure should preferably be stiff enough to install without too much stretch of the cable, which could potentially result in damage to the optical fibre(s). In some embodiments a strength member may be incorporated in the fibre optic cable to limit the overall extent of longitudinal extension of the fibre to prevent damage to the cable, and in particular to the optical fibre, during handling and installation where relatively high longitudinal forces may be experienced. Additionally or alternatively a pull cord or other apparatus for limiting the extension of the cable may be attached to or formed within the cable structure.

It will be understood that optical fibres wound with metallic material have been proposed previously. For instance, as noted above metallic braiding has previously been used for armouring in conventional fibre optic cables. In such cables however the braiding has been tightly wound and tightly interwoven and, as such, is not configured to be deformable together with a compliant core so as to translate a radial deformation into a longitudinal deformation. In conventional fibre optic cables any such braiding is configured to have limited deformation and provides no mechanical advantage and does not function as a strain transformer.

It has also been proposed to use magnetostrictive material, which may be metallic, in a fibre optic cable to sensitise the fibre optic cable to varying magnetic fields. Any varying magnetic fields could then be detected using the techniques of DAS applied to such a cable comprising magnetostrictive material. However such magnetically sensitised fibre optic cables are designed for a directly induced length change in the magnetostrictive material and such magnetically sensitise cables have not provided a deformable strain transformer configured to be deformable to translate a radial strain into a longitudinal strain. Whilst the principles of the present invention could be applied using magnetostrictive material for the strain transformer in some embodiments of the invention the material of the strain transformer is not magnetostrictive.

Figure 5A:
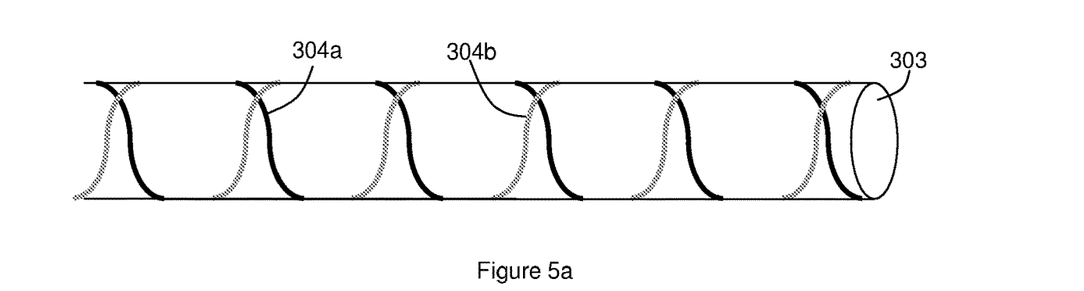
FIGS. 5*a* and 5*b* illustrate two further embodiments of the present invention.

FIG. 3 illustrates a single coiled member 304 wound in a continuous helix. It will be understood however that various other arrangements may be used. For example there may be different helical members at different parts of the fibre optic cable. It may not be possible to provide one single continuous helical coiled member for the entire length of the fibre optic cable and thus different lengths of the optical fibre may be provided with different coiled helical members. In some embodiment a given length of fibre optic cable may have more than one strain transformer, e.g. more than one helical coiled member. For example, as illustrated in FIG. 5a, at least one helical coiled member 304a may be provided for a given length of cable winding in one direction, e.g. clockwise, and another helical coiled member 304b may be provided for the same length of fibre winding in the opposite direction, e.g. anti-clockwise. Having helical members which wind in opposite directions along the same length of fibre optic cable may aid in even strain transformation.

Figure 5B:
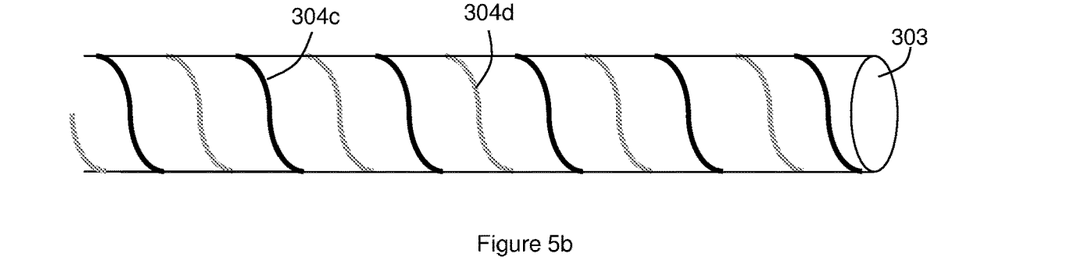

Additionally or alternatively one helical coiled member 304c may be interleaved with another helical coiled member 304d with winding in the same sense. As mentioned above the helix winding angle may be chosen to provide a desired mechanical advantage. This will therefore define the helix pitch for a given diameter of compliant core material 303. In some instance providing more than one helical winding may help ensure that localised transverse strains are at least partly transformed to a longitudinal length change. For example if the diameter, D, of the helical structure is of the order of 8 mm, and the helix angle, a, is of the order of 10° then the helix pitch is about 4.4 mm (based on pitch=$\pi \times D \tan(a)$). It may be wished to have elements of the strain transformer along one side of the compliant core at a spacing less than 4.4 mm and thus two or more helical structures may be interwound.

Figure 6:
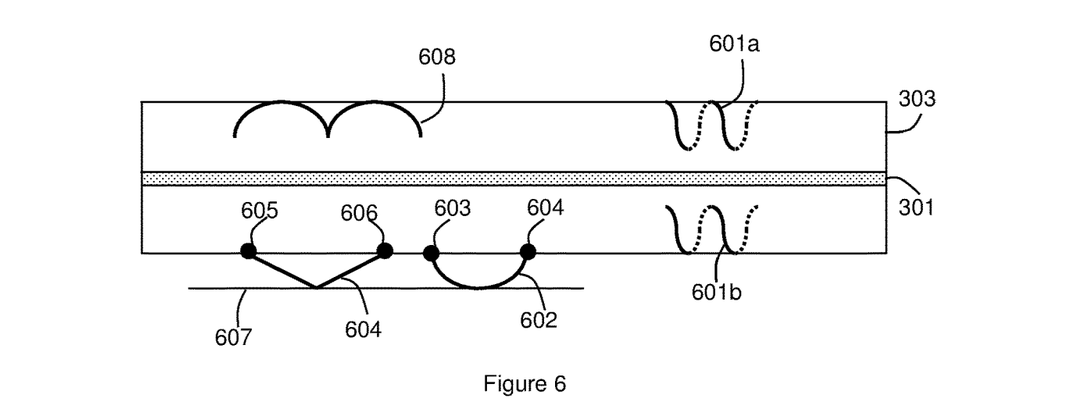
FIG. 6 illustrates other types of possible strain transformer.

A helically wound strain transformer wound around the outside of a compliant core material has the advantages described above and can be manufactured relatively easily. However there are other designs of strain transformer that could be used in some embodiments. FIG. 6 illustrates some examples.

In some embodiments one or more helical strain transformers may be used that do not encircle the compliant core material 303 or even the optical fibre(s) 301. For example a helical strain transformer 601a may be wound helically with respect to an axis parallel to the cable axis but arranged to one side of the optical fibre 301, for instance embedded within compliant core material 303. At least one other similar helical strain transformer 601b could be arranged on the other side of the optical fibre(s) to provide an even strain transformation on both side of the optical fibre(s).

In some embodiments one or more strain transformers with convex shapes could be anchored to the exterior of the compliant core material. For instance strain transformer 602 is anchored to the compliant core material at points 603 and 604 which are longitudinally separated from one another and comprises a generally curved element extending between the anchor points, such that the overall length of the strain transformer is greater than longitudinal separation. An inward radial force will tend to deform the strain transform forcing the anchoring point apart. Strain transformer 604 is similar and is anchored at point 605 and 606 but comprises two generally straight rods that may for example be joined at a pivot point. The exterior of the compliant core may be surrounded be several such strain transformers so as to respond to a transverse force from any direction and the strain transformers may be coupled to a force plate for even force distribution. Strain transformer 608 is somewhat similar but embedded within the compliant core material 302.

In some embodiments the strain transformer may comprise corrugated tubing or capsules coupled to the core material, for instance stainless steel corrugated tubing.

Figure 7A:
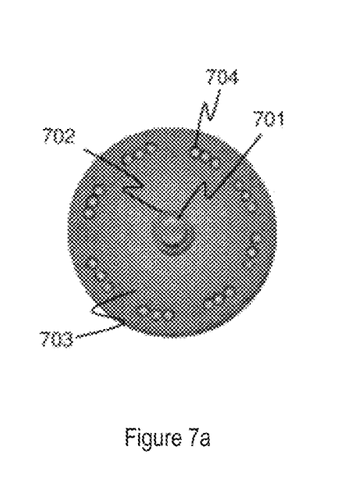
FIGS. 7*a* and 7*b* illustrate an example cable structure that was fabricated and FIG. 7*c* illustrates a control cable structure.
Figure 7B:
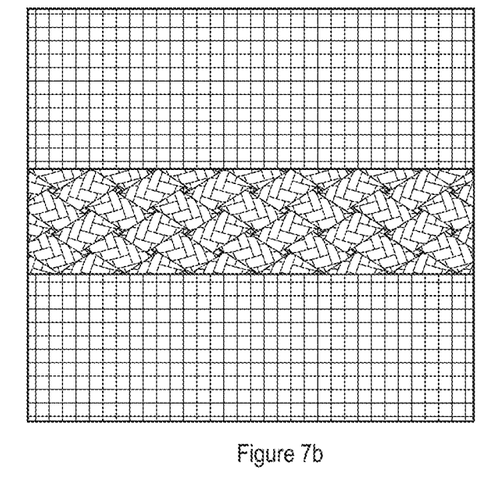

In one example a first cable was fabricated with a helical strain transformer. FIG. 7a shows a cross section of the cable structure. A single optical fibre 701 with an acrylate coating 702 was buffered with nylon 703 to a diameter of 0.4 mm before being over-braided with 80 micron diameter nickel wires 703. The braiding configuration was eight groups of three wires with a lay length of 6.5 mm. FIG. 7b shows a micrograph of the braided buffered optical fibre. After braiding, the cable was sheathed with a thin layer of nylon to bind the system together. The total diameter after braiding and sheathing was 0.9 mm.

Figure 7C:
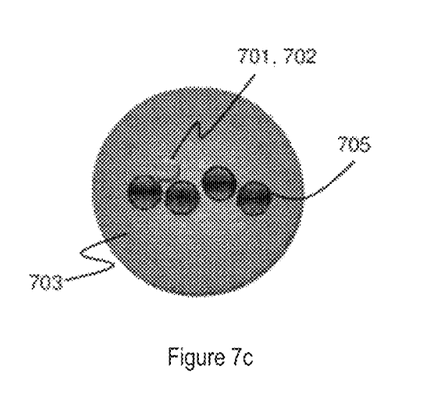

To provide comparative examples a second cable was manufactured with a cross section as illustrated in FIG. 7c. In this design an acrylate coated single mode fibre 701, 702 (similar to that used for the first cable) was buffered in nylon 703 along with four 150 micron diameter nickel wires 705. The Ni wires were arranged to run parallel to the optical fibre and the wires and optical fibre were passed through an extruding head. Nylon 12 was extruded around the fibre/wire arrangement to a total diameter of 1 mm before being water cooled. The cross sectional of the second cable and the cross sectional area of the nickel within the second cable is thus substantially the same as for the first cable.

Figure 8:
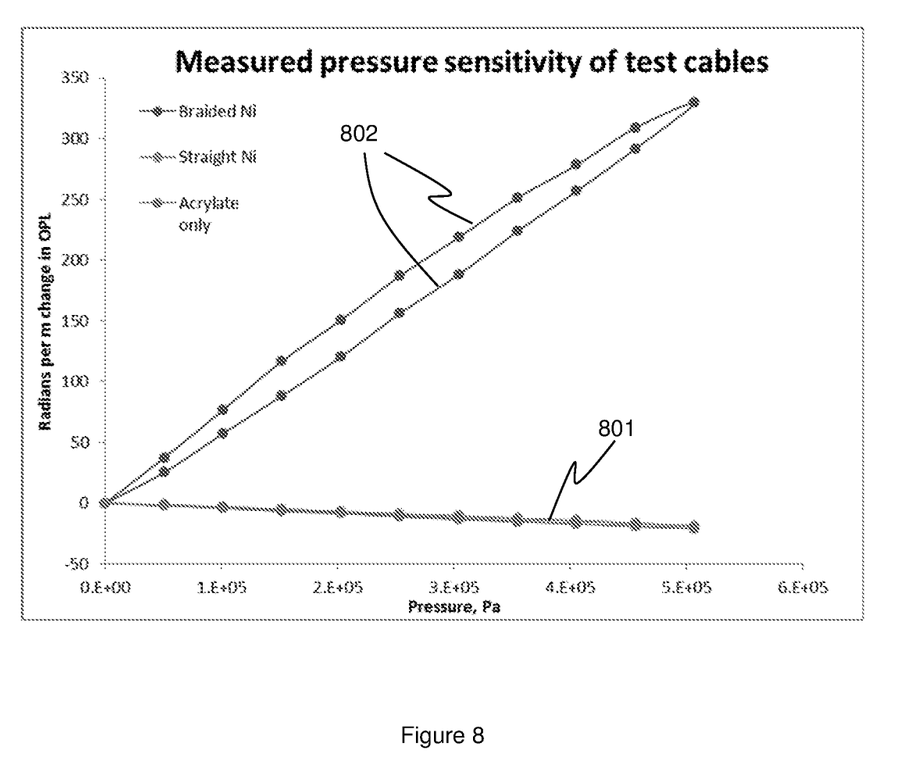
FIG. 8 illustrates some test results using the cable structures illustrated in FIGS. 7*a-c*.

The same length of each of the first and second cables were produced. The lengths of cable were connected to a DAS interrogator unit (IU) and the change in optical phase of the DAS measurement signal determined whilst subjecting the cables to a controlled pressure variation in a pressure chamber. A similar test was performed using just the acrylate coated single mode optical fibre without any buffer or nickel wires. FIG. 8 shows some test results as the pressure was stepped up in 0.5 Bar increments from 0 BarG up to 5 BarG, then stepped back down. It was ensured that the fibre was overstuffed in the pressure chamber so that changes in length of the pressure chamber with pressure would not affect the fibre. The change in optical path length was measured using the IU, and was then normalised for a 1 m length of fibre. The second cable, with the straight nickel wires, exhibited a pressure response 801 that was substantially the same as the unbuffered acrylate coated fibre (the response of which is largely masked in FIG. 8 by the superimposed plot 801). By contrast the response of the first cable, with the helical braided strain transformer, is seen to have 18 times greater sensitivity to pressure than the equivalent second cable with axially laid stiffening members. This provides a clear demonstration that the sensitivity of a fibre optic cable with a suitable strain transformer such as described above can provide a significant increase in sensitivity to pressure, i.e. transverse strains, than a conventional optical fibre (e.g. the acrylate coated fibre) or a cable without a strain transformer.

Note that in this test some hysteresis in the response of the first cable can be seen, this may be indicative of insufficient bonding between the wires forming the strain transformer and the optical fibre in the test cable.

These results also show that, in this example, the response of the unbuffered optical fibre or the second cable without a strain transformer is negative with increasing pressure, i.e. the normalised optical phase detected by the DAS IU, was determined to about $-42\mu$ rads/m/Pa. This is a small effect and, counter-intuitively, the sign of the response is negative. In other words increasing the pressure has the effect of seemingly reducing the effective optical path length.

It is believed that as the surface pressure on the optical fibre increases the optical fibre may experience a physical length change, i.e. a stretching, which may tend to increase the optical path length but there is also a modulation of refractive index that tends to reduce the effect path length. The overall response is a result of both of these contribution and in the example illustrated in FIG. 8 without a strain transformer the refractive index modulation effect seems to dominate.

A suitable strain transformer can thus provide a mechanical advantage to the length change such that it dominates and thus significantly improve the sensitivity to pressure variations due to transverse acoustic waves. In other words the magnitude of the response of the optical fibre of the cable to transverse strains or pressure variation is greater than the response of a corresponding optical fibre or a standard unbuffered optical fibre to a given transverse strain or pressure. As noted above an unbuffered optical fibre may be expected to exhibit a variation in phase of a measurement signal of the order of $-40\mu$ rads/m/Pa (at a wavelength of around 1550 nm). Most standard silica based optical fibres will exhibit a similar response. The strain transformer may improve the sensitivity such that the magnitude of the phase change with pressure change may be greater than that of an unbuffered optical fibre. The strain transformer may provide a magnitude of response which is at least 25% greater, or at least 50% greater, or at least 100% greater than for a standard unbuffered cable or at least five times greater or at least ten times greater. A high sensitivity cable may be seen as one where the magnitude of response of an optical fibre to a traverse strain or pressure change in terms of path length change is of the order of $80\mu$ rads/m/Pa or greater, for instance greater than $200\mu$ rads/m/Pa.

The present inventor(s) have also appreciated however that the response of the strain transformer can be tuned such that there is substantially no response of the optical fibre of the cable to any pressure variations. In other words if the strain transformer is configured so that as the pressure increase the effect due to the resultant refractive index variation (tending to reduce effective optical path length) is substantially opposite and equal to the effect of the length change.

Thus in some embodiments the strain transformer may be configured with respect to the optical fibre and the particular compliant core material so that the cable would be substantially insensitive to any pressure variations, i.e. transverse strains, acting on the cable, e.g. such as from acoustic stimuli incident from a direction transverse to the cable axis, if such a cable were use for DAS.

To tune the response of a helical strain transformer say the helix angle and/or total stiffness of the strain transformer may be tuned. The discussion above describes how the stiffness and/or helix angle may impact on the mechanical advantage provided by the strain transformer and one skilled in the art would be able to devise a suitable strain transformer. Standard silica-based optical fibres will tend to have a similar response to one another to applied transverse strain/pressure.

One skilled in art would readily be able to fabricate and test various designs along the lines described above in order to determine a suitable arrangement.

A fibre optic cable that would is substantially insensitive to transverse strains may be advantageous for other types of distributed fibre optic sensing, particularly Rayleigh backscatter based distributed fibre optic sensing. For example the principles of Rayleigh based distributed fibre optic sensing have been applied to monitoring temperature variations as temperature variations will also result in expansion/contraction of the sensing fibre and/or refractive index modulations that result in a change in effect optical path length. When monitoring temperature changes, which tend to be relatively low frequency changes, it is possible to apply low pass filtering to the detected signals to avoid the effects of higher frequency acoustic stimuli. However it is difficult to distinguish between measurement signals due to temperature changes and measurement signals due to low frequency strains/pressure variations. A fibre optic cable according to an embodiment of the present invention which is relatively insensitive to transverse strains or pressure variations may therefore be used for distributed fibre optic temperature change sensing and will inherently be insensitive to background pressure variations that may otherwise mask the signal of interest.

In some embodiments determination of temperature changes using a fibre optic cable which is designed to be insensitive to pressure could be used to calibrate or correct for temperature based variations in a DAS sensor that is used to detect pressure variations (which may or may not use a fibre optic cable according to an embodiment of the present invention which is configured to have a high sensitivity to transverse strains).

The principles of Rayleigh based distributed fibre optic sensing have been applied to monitoring magnetic field variations by coupling the optical fibre to a magnetostrictive material. Changes in magnetic field strength cause a change in the dimensions of the magnetostrictive material which can impart a detectable strain on the optical fibre.

Again however it can be difficult to distinguish strains due to a varying magnetic field from strains due to an incident pressure wave. Again using a fibre optic cable which is configured to be substantially insensitive to pressure variations in such a fibre optic sensor may result in a better signal to noise ratio for the signal of interest.

In some applications, for instance for using DAS for detecting movement of trains on a rail network, the acoustic signal received at the sensing fibre may be a large amplitude signal. This can possible cause the DAS sensor to overscale, i.e. for a phase change measuring DAS system the resultant phase change may be greater than $2\pi$ radians. A cable structure with a reduced pressure sensitivity may be deployed in some instances, where the signal of interest is a large amplitude signal, so as to reduce the likelihood of overscaling.

It should be noted that in the embodiments described above the strain transformer(s) are generally arranged such that the cable is substantially equally responsive to a transverse strain incident from any transverse direction. However in some instances the strain transformer(s) may be arranged to provide a strain transformation for incident transverse strains for only one or more predetermined directions. In other words the strain transformers may be arranged to make the cable structure directionally sensitive to defined transverse directions and relatively insensitive to waves propagating in an orthogonal transverse direction.

Embodiments of the invention are particular suitable for use as sensing cables for fibre optic distributed acoustic sensing based on Rayleigh scattering as the strain transformer converts at least some transverse force into a longitudinal strain on the optical fibre resulting in a change of path length. However the cable structures of the present invention may be used in a range of applications and, for instance, as sensing cables for other types of sensor.

The fibre optic cable structure of the present invention may for instance be deployed for seismic surveying. The fibre optic cable structure may be deployed in a bore hole to be sensitive to transverse seismic waves and may for instance be used for vertical seismic profiling. In some embodiments the fibre optic cable structure may be deployed at or near the surface of an area of interest, for instance buried in a shallow trench, for surface seismic surveying for receiving seismic signals travelling substantially vertically.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A fibre optic cable having a longitudinal cable axis comprising;
   at least one optical fibre;
   a compliant core material surrounding and mechanically coupled to the at least one optical fibre such that a longitudinal force acting on the compliant core material induces a longitudinal strain in the at least one optical fibre; and
   at least one deformable strain transformer coupled to the compliant core material and configured such that a force acting on the strain transformer in a direction transverse to the cable axis results in a deformation of the strain transformer thereby applying a longitudinal force to the compliant core material; wherein the at least one strain transformer comprises at least one helically coiled member wherein the helically coiled member is coiled around said compliant core member, wherein the at least one optical fibre is tightly coupled to a buffer material and the buffer material is coupled to the compliant core material.

2. A fibre optic cable as claimed in claim 1 wherein at least a portion of the strain transformer has a shape with a resting longitudinal length in the absence of any external force applied to the cable and is configured such that deformation of the strain transformer in response to a force transverse to the cable axis over a first portion of the cable causes a change in the longitudinal length of strain transformer.

3. A fibre optic cable as claimed in claim 1 wherein the at least one strain transformer is at least partly embedded with the compliant core material.

4. A fibre optic cable as claimed in claim 1 wherein the helix angle of said helically coiled member is less than 45 degrees.

5. A fibre optic cable as claimed in claim 1 wherein the helix angle of said helically coiled member is greater than 5 degrees.

6. A fibre optic cable as claimed in claim 1 wherein the diameter of said helically coiled member is in the range of 3 to 10 mm.

7. A fibre optic cable as claimed in claim 1 wherein at least one portion of the fibre optic cable comprises a plurality of strain transformers, each strain transformer comprising a helically wound coiled member.

8. A fibre optic cable as claimed in claim 7 wherein at least one helically wound coiled member is wound in the opposite direction to another helically wound coiled member.

9. A fibre optic cable as claimed in claim 7 wherein at least one helically wound coiled member is interleaved with another helically wound coiled member.

10. A fibre optic cable as claimed in claim 1 wherein the strain transformer and compliant core material have a strain response of between 0.05% to 0.01% strain per Newton tensile load.

11. A fibre optic cable as claimed in claim 1 wherein the strain transformer comprises a shaped steel member.

12. A fibre optic cable as claimed in claim 1 wherein the compliant core material comprises extruded nylon.

13. A fibre optic cable as claimed in claim 1 comprising a first jacket layer wherein the at least one optical fibre, the compliant core material and the at least one strain transformer are disposed within the first jacket layer.

14. A fibre optic cable as claimed in claim 13 wherein at least part of the strain transformer is coupled to the first jacket layer.

15. A fibre optic cable as claimed in claim 13 wherein the strain transformer and compliant core material are disposed so as to be moveable with respect the first jacket layer.

16. A fibre optic cable as claimed in claim 15 wherein the at least one optical fibre, the compliant core material and the at least one strain transformer may be disposed within a liquid contained within the first jacket layer.

17. A fibre optic cable as claimed, in claim 1 wherein the strain transformer is configured with respect to the compliant core material and the optical fibre to provide a relatively low transverse sensitivity.

18. A fibre optic cable as claimed in claim 17 wherein the strain transformer is configured with respect to the compliant material and optical fibre such that a transverse strain on a given portion of the cable results in substantially no change in the effective optical path length of that portion of the optical fibre.

19. A method of distributed fibre optic sensing comprising interrogating an optical fibre of a fibre optic cable as claimed in claim 17 which is relatively insensitive to transverse acoustic signals.

20. A method as claimed in claim 19 comprising sensing for temperature variations.

21. A fibre optic cable having a longitudinal cable axis comprising:

at least one optical fibre:

a compliant core material surrounding and mechanically coupled to the at least one optical fibre such that a longitudinal force acting on the compliant core material induces a longitudinal strain in the at least one optical fibre; and at least one deformable strain transformer coupled to the compliant core material and configured such that a force acting on the strain transformer in a direction transverse to the cable axis results in a deformation of the strain transformer thereby applying a longitudinal force to the compliant core material: wherein the at least one strain transformer comprises at least one helically coiled member wherein the helically coiled member is coiled around said compliant core member; and a first jacket layer wherein the at least one optical fibre, the compliant core material, and the at least one strain transformer are disposed within the first jacket layer so as to be moveable with respect to the first jacket layer, wherein the at least one optical fibre, the compliant core material, and the at least one strain transformer are contained within a second jacket layer which is disposed within the first jacket layer, with the second jacket layer being moveable with respect to the first jacket layer.

* * * * *